United States Patent [19]
Lee

[11] Patent Number: 6,130,843
[45] Date of Patent: Oct. 10, 2000

[54] METHOD AND CIRCUIT FOR PROVIDING A MEMORY DEVICE HAVING HIDDEN ROW ACCESS AND ROW PRECHARGE TIMES

[75] Inventor: Terry R. Lee, Boise, Id.

[73] Assignee: Micron Technology, Inc., Boise, Id.

[21] Appl. No.: 09/145,866

[22] Filed: Sep. 2, 1998

[51] Int. Cl.[7] .................................................. G11C 16/04
[52] U.S. Cl. ................. 365/189.05; 365/203; 365/238.5
[58] Field of Search ............................... 365/189.05, 203, 365/193, 238.5, 189.01, 230.01

[56] References Cited

U.S. PATENT DOCUMENTS

| | | | |
|---|---|---|---|
| 5,497,351 | 3/1996 | Oowaki | 365/230.03 |
| 5,631,871 | 5/1997 | Park et al. | 365/203 |
| 5,749,086 | 5/1998 | Ryan | 711/105 |

*Primary Examiner*—David Nelms
*Assistant Examiner*—Hoai V. Ho
*Attorney, Agent, or Firm*—Dorsey & Whitney LLP

[57] ABSTRACT

A memory device has address, data, and control buses, and a memory-cell array including a number of memory cells arranged in rows and columns, each memory cell operable to store a bit of data. A row address decoder circuit is adapted to receive a row address applied on the address bus and operates to decode the row address and activate a row of memory cells corresponding to the decoded row address. A column address decoder circuit is adapted to receive a column address applied on the address bus and operates to decode the column address and access a plurality of memory cells in the activated row. The data stored in the plurality of memory cells in the activated row is defined as a block of data. A precharge circuit is coupled to the memory-cell array and operates, when activated, to precharge and equilibrate the memory-cell array. A block read latch circuit operates to latch a first block of data accessed in the memory-cell array corresponding to first decoded row and column addresses, and to sequentially transfer subblocks of the first block of data onto the data bus. The memory device operates such that after the first block of data is latched in the block read latch, the precharge circuit first precharges and equilibrates the memory-cell array, and the row and column decoder circuits then decode second row and column addresses such that the column address decoder circuit accesses a second block of data corresponding to the second row and column addresses before the block read latch circuit has completed sequentially transferring all the subblocks of the first block of data onto the data bus. The memory device may further include a block write latch circuit adapted to sequentially receive on the data bus subblocks of data contained in a first block of data to be written to the memory-cell array.

20 Claims, 8 Drawing Sheets

METHOD AND CIRCUIT FOR PROVIDING A MEMORY DEVICE HAVING HIDDEN ROW ACCESS AND ROW PRECHARGE TIMES

TECHNICAL FIELD

The present invention is directed generally to semiconductor memory devices and, more specifically, to a dynamic random access memory having hidden row access and row precharge times.

BACKGROUND OF THE INVENTION

Semiconductor memories are utilized in a variety of applications, including digital communications systems in which the memories may be used for the temporary storage of data transmitted to or received from a communications network. Communications networks increasingly transfer data at faster rates, so the semiconductor memories transferring data to or receiving data from the communications network must be capable of performing such transfers at corresponding faster rates. For example, some local and wide area communications networks may transfer data at a rate of up to 155 million bits per second ("Mbps") in asynchronous transfer mode ("ATM"). Where such high data transfer rates are required, static random access memories ("SRAMs") are typically utilized due to the relatively high bandwidth of SRAMs. The bandwidth of a memory device is the rate, in bits per second, at which data is transferred to and from the device. Although SRAMs provide the necessary bandwidth in such applications, they are relatively costly in terms of price per bit when compared to conventional dynamic random access memories ("DRAMs"). Thus, it is desirable to utilize DRAMs in place of SRAMs in these high-speed communications networks. Conventional DRAMs, however, have insufficient bandwidth to transfer data at the rates required by these high-speed communications networks.

FIG. 1 is a signal timing diagram of a read data transfer operation for a conventional DRAM having an address bus ADDR, a data bus DQ, and a control bus. As known in the art, the DRAM includes a memory-cell array comprising a number of memory cells arranged in rows and columns, each memory-cell storing a binary bit of data. To begin the read data transfer operation, an external circuit, such as a microprocessor or a DRAM controller, drives a write enable signal $\overline{WE}$ high to define a read data transfer operation and drives an output enable signal $\overline{OE}$ low to enable the DRAM to place addressed data on the data bus DQ. The external circuit then applies a row address ROWX on the address bus ADDR and drives a row address strobe signal $\overline{RAS}$ low at a time $t_0$. In response to the row address strobe signal $\overline{RAS}$ going low, the DRAM latches the row address ROWX and row address decode circuitry decodes the row address ROWX and activates a corresponding row of memory cells in the memory-cell array. After the external circuit drives the row address strobe signal $\overline{RAS}$ low, it delays for a fixed amount of time, places a column address COLM on the address bus ADDR, and thereafter drives a column address strobe signal $\overline{CAS}$ low at a time $t_1$. The DRAM latches the column address COLM in response to the signal $\overline{CAS}$ going low and column address decode circuitry begins decoding the column address COLM. At about a time $t_2$, the row address ROWX and column address COLM have been decoded and the DRAM places on the data bus DQ the addressed data D1 where it is read by the external circuit.

After the external circuit has read the data D1, it drives the signals $\overline{OE}$, $\overline{RAS}$, and $\overline{CAS}$ high in preparation for the next data transfer operation with the DRAM. In response to the signal $\overline{OE}$ going high, the DRAM, after a short delay, removes the data D1 from the data bus DQ. The external circuit must maintain the row address strobe signal $\overline{RAS}$ high for at least a row precharge time $t_{RP}$ before beginning the next data transfer operation with the DRAM. The row precharge time $t_{RP}$ is the time required by the DRAM to precharge and equilibrate the memory-cell array and reset the address decode circuitry in anticipation of the next data transfer operation. In FIG. 1, the row precharge time $t_{RP}$ lasts from the time $t_2$ until a time $t_3$ at which time the external circuit begins the next read data transfer operation by placing a new row address ROWY on the data bus DQ and driving the row address strobe signal $\overline{RAS}$ low causing the DRAM to latch and begin decoding the new row address ROWY. The external circuitry then places a new column address COLN on the address bus ADDR, drives the column address strobe signal $\overline{CAS}$ low, and the DRAM, in response to the signal $\overline{CAS}$ going low, latches and begins decoding the new column address COLN. The DRAM operates as previously described to supply new data D2 on the data bus DQ where it is once again read by the external circuit.

The bandwidth of a conventional DRAM is limited by a cycle time $t_{RC}$ corresponding to the minimum amount of time the external circuit must wait between consecutive data transfer operations. This is true because data can be read from the DRAM only once during the cycle time $t_{RC}$. The cycle time $t_{RC}$ is approximately equal to the sum of the row precharge time $t_{RP}$ and a row access time $t_{RAC}$ which is the amount of time it takes the DRAM to present data on the data bus DQ after a row address has been latched into the DRAM in response to the row address strobe signal $\overline{RAS}$ going low. The row access time $t_{RAC}$ includes the time it takes the DRAM to latch, decode, and activate the row of memory cells corresponding to the row address ROWX. Also shown in FIG. 1 is a column access time $t_{CAC}$ corresponding to the time it takes the DRAM to present data on the data bus DQ after the column address strobe signal $\overline{CAS}$ goes low. The column access time $t_{CAC}$ includes the time it takes the DRAM to latch, decode and access the column of memory cells corresponding to the column address COLM. As seen in the signal timing diagram, the column access time $t_{CAC}$ is much shorter than the row access time $t_{RAC}$ due to the inherent nature of activating an addressed row of memory cells in the memory-cell array versus accessing an addressed memory-cell in one of the columns within the activated row as known in the art.

Various modes of operation for DRAMs have been developed to take advantage of the shorter column access time $t_{CAC}$ and thereby increase the bandwidth of the DRAM. One such mode of operation is known as Fast Page Mode and is illustrated in the signal timing diagram of FIG. 2. In Fast Page Mode operation, each row of memory cells is designated a page and data is read from or written to random columns of memory cells contained in an activated page. The increased bandwidth of Fast Page Mode operation is realized by exploiting the much shorter column access time $t_{CAC}$ when compared to the row access time $t_{RAC}$ as previously discussed. In Fast Page Mode operation, the external circuit places an initial row address ROWX on the address bus ADDR and drives the row address strobe signal $\overline{RAS}$ low at time $t_0$ to latch the row address ROWX in the DRAM. The external circuit then places an initial column address COLM on the address bus ADDR and drives the column address strobe signal $\overline{CAS}$ low at a time $t_1$ to latch the column address COLM in the DRAM. As previously described, the DRAM decodes the row and column addresses and at a time $t_2$ places the corresponding data D1 on the data bus DQ.

Up to time $t_2$, the Fast Page Mode read operation is identical to the conventional read operation previously described with reference to FIG. 1. In contrast to the conventional read operation, however, at time $t_2$ the external circuitry maintains the row address strobe signal $\overline{RAS}$ low keeping the initial addressed row ROWX activated. The external circuit thereafter drives and maintains the column address strobe signal $\overline{CAS}$ high for at least a column precharge time $t_{CP}$. The column precharge time $t_{CP}$ is the time during which various circuits in the DRAM are pre-charged and equilibrated in anticipation of placing on the data bus DQ the data corresponding to a subsequent column address. It should be noted that the column precharge time $t_{CP}$ is significantly shorter than the row precharge time $t_{RP}$. The external circuit then places a second column address COLN on the address bus ADDR and drives the column address strobe signal $\overline{CAS}$ low at a time $t_3$ causing the DRAM to latch and decode the column address COLN. At a time $t_4$, the DRAM places on the data bus DQ the data D2 corresponding to the column address COLN where it is read by the external circuitry. The external circuitry thereafter drives the column address strobe signal $\overline{CAS}$ high, places the next column address COLQ on the address bus ADDR and once again drives the column address strobe signal $\overline{CAS}$ low at a time $t_5$ causing the DRAM to latch and decode this column address and place on the data bus DQ the corresponding data D3 at a time $t_6$ where it is likewise read by the external circuitry.

In Fast Page Mode operation, the external circuit reads data from as many columns in the active page as desired by sequentially placing new column addresses on the address bus ADDR and toggling the column address signal $\overline{CAS}$ at a Page Mode cycle time $t_{PC}$ as shown. In response to the toggling column address strobe signal $\overline{CAS}$, the DRAM sequentially latches and decodes the column addresses and places the corresponding data on the data bus DQ at the appropriate times. In Fast Page Mode operation, as long as data is read from memory cells in the activated page the bandwidth of the DRAM is determined by the Fast Page Mode cycle time $t_{PC}$ which is substantially less than the cycle time $t_{RC}$ of a conventional DRAM since no row precharge time $t_{RP}$ and row access time $t_{RAC}$ delays are incurred. When data must be read from a different page, however, the external circuit must drive the row address strobe signal $\overline{RAS}$ high, as shown at time $t_7$, and delay the row precharge time $t_{RP}$ before a subsequent row address ROWY is latched into the DRAM as previously described. Moreover, after the row precharge time $t_{RP}$ the external circuit drives the signal $\overline{RAS}$ low at a time $t_8$, but data will not be supplied on the data bus DQ until the row access time $t_{RAC}$ after the signal $\overline{RAS}$ is driven low. Thus, in the Fast Page Mode of operation, the bandwidth of the DRAM is negatively affected by the row precharge time $t_{RP}$ and row access time $t_{RAC}$ when the external circuit addresses data in a page other than the active page. The accessing of data in a page other than the active page is known as a "Page Miss."

Another mode of operation for increasing the bandwidth of DRAMs is known as Extended Data Output (EDO) Page Mode of operation and is similar to the conventional Page Mode of operation just described with reference to FIG. 2 except that in the EDO Page Mode of operation the DRAM supplies data on the data bus DQ even after the column address strobe signal $\overline{CAS}$ goes high. With reference to FIG. 2, the transition of the column address strobe signal $\overline{CAS}$ just after the time $t_2$ turns off, after a time delay, the data D1 supplied by the DRAM on the data bus DQ. Thus, the external circuit must delay in driving the column address strobe signal $\overline{CAS}$ high to ensure it has adequate time to read the data supplied by the DRAM on the data bus DQ. In contrast, in the EDO Page Mode of operation the DRAM supplies data on the data bus DQ after the high-going transition of the column address strobe signal $\overline{CAS}$ thereby allowing the external circuit to drive the signal $\overline{CAS}$ high at an earlier time. For example, with reference to FIG. 2, in the EDO Page Mode of operation the external circuit drives the column address strobe signal $\overline{CAS}$ high just before the time $t_2$ but does not read the data D1 until time $t_2$ as in conventional Page Mode operation. By driving the column address strobe signal high before the time $t_2$, the column precharge time $t_{CP}$ is initiated before the data D1 is output on the data bus DQ thereby enabling the external circuit to more quickly latch a new column address into the DRAM after the external circuit has read the data D1. The Page Mode cycle time $t_{PC}$ is accordingly reduced, resulting in a corresponding increase in the bandwidth of the DRAM.

FIG. 3 is a signal timing diagram illustrating a read data transfer operation during another mode of operation for increasing the bandwidth of a DRAM known as Burst Mode. A Burst Mode DRAM includes an internal column address counter which develops, in response to the external circuit toggling the column address strobe signal $\overline{CAS}$, sequential column addresses starting at the column address placed on the address bus ADDR. In Burst Mode operation, the external circuit places a row address ROWX on the address bus ADDR and drives the row address strobe signal $\overline{RAS}$ low at a time $t_0$. In response to the signal $\overline{RAS}$ going low, the DRAM latches the row address ROWX, and decode circuitry in the DRAM decodes the row address and activates the page corresponding to this row address. The external circuit thereafter places a column address COLM on the address bus ADDR and drives the column address strobe signal $\overline{CAS}$ low at a time $t_1$. In response to the column address strobe signal $\overline{CAS}$ going low, the DRAM latches the column address COLM, and address decode circuitry in the DRAM decodes the column address and activates the column corresponding to this column address. The external circuit thereafter toggles the column address strobe signal $\overline{CAS}$ at the burst Page Mode cycle time $t_{PC}$ to clock the internal column address counter.

In operation, after the row address ROWX and column address COLM have been decoded the DRAM first places on the data bus DQ the data DATAM corresponding to the column address COLM. The DRAM then sequentially places on the data bus DQ the data DATAM+1, DATAM+2, and DATAM+3 corresponding to column addresses M+1, M+2, and M+3, respectively, developed by the internal column address counter in response to the external circuit toggling the signal $\overline{CAS}$. Note that at a time $t_2$ the external circuit places a second column address COLN on the address bus ADDR which the DRAM subsequently latches and then places on the data bus DQ the DATAN-N+3 as previously described. In the typical Burst Mode shown in FIG. 3, the external circuit provides one column address on the address bus ADDR for every four bits of data output by the DRAM, but varying burst lengths can likewise be provided. The internal generation of column addresses in Burst Mode reduces the Page Mode cycle time $t_{PC}$ since the address setup and hold times required in conventional Page Mode or EDO Page Mode operation are eliminated. The reduced Page Mode cycle time $t_{PC}$ in Burst Mode translates to a higher bandwidth for Burst Mode operation.

In burst mode operation, a burst cycle must be terminated and the row precharge time $t_{RP}$ must elapse before a new row address ROWY can be latched into the DRAM at a time $t_3$ to begin another burst cycle. In addition, after the new row address ROWY is latched by the DRAM, data corresponding to this new burst page is not available until after expiration of the row access time $t_{RAC}$ as previously described. In other words, when a Page Miss occurs, addressed data stored in the newly addressed page cannot be read out of the DRAM until after expiration of the row precharge time $t_{RP}$ and the row access time $t_{RAC}$. As previously described, the sum of the row access time $t_{RAC}$ and row precharge time $t_{RP}$ is much greater than the Page Mode cycle time $t_{PC}$ so Page Misses lower the bandwidth of the Burst Mode DRAM because the external circuit must delay this longer time before reading data from the DRAM. Thus, in Burst Mode operation, as with the other previously described DRAM modes of operation, the bandwidth of the DRAM is decreased by Page Misses.

There is a need for a high-speed DRAM that can access data stored in random pages without the Page Miss penalty associated with conventional DRAMs.

SUMMARY OF THE INVENTION

A memory device has an address bus, data bus, and control bus and includes a memory-cell array having a number of memory cells arranged in rows and columns, each memory cell operable to store a bit of data. A row address decoder circuit is adapted to receive a row address applied on the address bus and operates to decode the row address and activate a row of memory cells corresponding to the decoded row address. A column address decoder circuit is adapted to receive a column address applied on the address bus and operates to decode the column address and access a plurality of memory cells in the activated row. The plurality of memory cells in the activated row is defined as a block of data. A precharge circuit is coupled to the memory-cell array and operates, when activated, to precharge and equilibrate the memory-cell array.

A block read latch circuit operates to latch a first block of data accessed in the memory-cell array corresponding to first decoded row and column addresses and to sequentially transfer subblocks of the first block of data onto the data bus. The memory device operates such that after the first block of data is latched in the block read latch circuit, the precharge circuit precharges and equilibrates the memory-cell array. The row and column decoder circuits then decode second row and column addresses such that the column address decoder circuit accesses a second block of data corresponding to the second row and column addresses. The second block of data is accessed before the block read circuit has completed sequentially transferring all the subblocks of the first block of data onto the data bus.

In another embodiment, the memory device further includes a block write latch circuit adapted to sequentially receive on the data bus subblocks of data contained in a first block of data to be written to the memory-cell array.

DETAILED DESCRIPTION OF THE INVENTION

Figure 4:
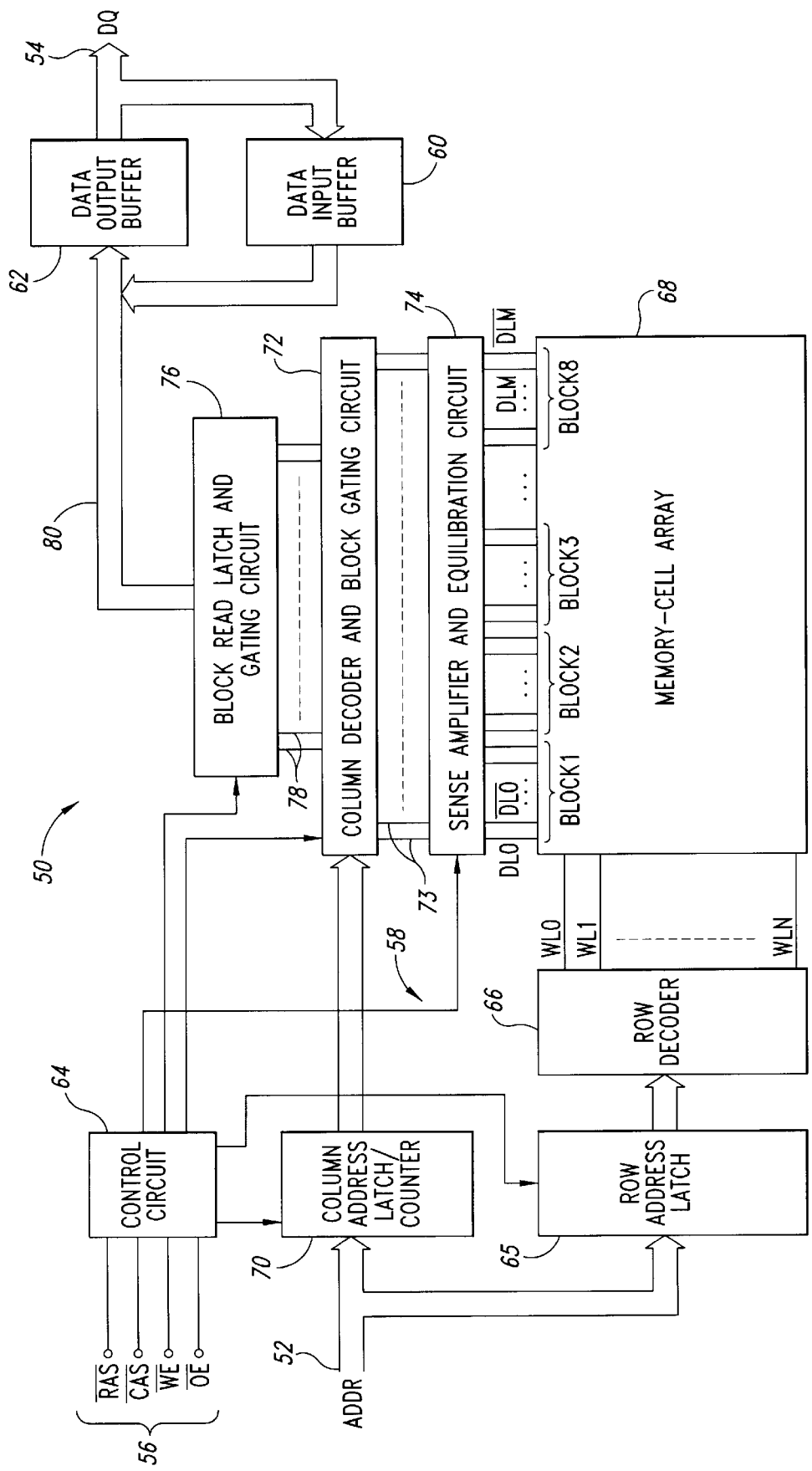
FIG. 4 is a functional block diagram of a dynamic random access memory according to one embodiment of the present invention.

FIG. 4 is a block diagram of a DRAM 50 according to one embodiment of the present invention. The DRAM 50 includes an address bus 52, a data bus 54, and a control bus 56 coupled, respectively, to address circuitry 58, data input and output buffers 60 and 62, and a control circuit 64. The DRAM 50 receives a row address strobe signal $\overline{RAS}$, a column address strobe signal $\overline{CAS}$, an output enable signal $\overline{OE}$, and a write enable signal $\overline{WE}$ on the control bus 56. The control circuit 64 controls the operation of the DRAM 50 in response to these signals as will be described in more detail below.

The address circuitry 58 includes a row address latch 65 operable to latch a row address on the address bus 52 and output the row address to a row decoder 66. The row decoder 66 decodes the row address and outputs a decoded row address by energizing one of a plurality of word lines WL to a memory-cell array 68. The memory-cell array 68 includes a plurality of memory cells (not shown) arranged in rows and columns with each memory cell storing a binary bit of data typically in the form of a charge on a capacitor as known in the art. Each memory cell in a particular row has an access terminal coupled to one of the word lines WL, and each memory cell in a particular column has a data terminal coupled to one of an associated pair of digit lines DL. In operation, the memory cells coupled to an activated word line WL couple their respective stored charges to the associated digit lines DL thereby causing a voltage differential on each pair of digit lines DL corresponding to the data stored in the associated memory cell.

A sense amplifier and equilibration circuit 74 is coupled to the digit lines DL of the memory-cell array 68 and includes circuitry for precharging and equilibrating the complementary digit lines DL, typically to a voltage of approximately $V_{CC}/2$. The circuit 74 also includes a plurality of sense amplifiers, each sense amplifier coupled to an associated pair of complementary digit lines DL. The sense amplifiers operate in a conventional manner to sense the voltage differential on the digit lines DL and drive the digit lines to complementary voltage levels corresponding to the data stored in the memory cell coupled to the digit lines DL. Each sense amplifier outputs the data stored in the associated memory cell in the form of complementary voltage levels developed on a corresponding pair of data lines 73. It should be noted that when a particular word line WL is activated, the data stored in each memory cell coupled to that word line WL is sensed and stored in an associated sense amplifier in the circuit 74. The sense amplifiers may have a variety of configurations and may be, for example, latching type sense amplifiers including N-sense and P-sense portions as known in the art.

In the DRAM 50, each row or page of memory cells in the memory-cell array 68 is divided into blocks corresponding to a number of memory cells in a particular page. There typically are an integer number of blocks in each page, but a block may also include an entire page. For example, in one embodiment the memory-cell array 68 includes 1024 rows and 1024 columns of memory cells, and each page is divided into eight blocks designated Block 1 to Block 8 of 128 memory cells per block. In this embodiment, Block 1 includes memory cells in columns 1–128, Block 2 includes memory cells in columns 129–256, and so on. As will be described in more detail below, the DRAM 50 enables random blocks of data to be accessed without experiencing the delays due to the row access time $t_{RAC}$ and row precharge time $t_{RP}$ normally associated with accessing different pages in conventional DRAMs.

The address circuitry 58 further includes a column address latch/counter circuit 70 operable in two modes. In the first mode, the column address latch/counter circuit 70 operates to latch a column address supplied on the address bus 52 and output the latched column address to a column decoder and block gating circuit 72. In the second mode, the latch/counter circuit 70 operates, in response to the control circuit 64, to develop sequential column addresses corresponding to subblocks of the addressed block of data as will be explained in more detail below. The column decoder and block gating circuit 72 is coupled to data lines 73 of the sense amplifier and equilibration circuit 74 and operates to decode the latched column address and, in response to the decoded column address, to couple the data lines 73 of the addressed block to associated pairs of output terminals 78. In this way, the circuit 72 decodes the column address and provides the data stored in each memory cell in the block corresponding to that column address on the output terminals 78. The number of pairs of output terminals 78 is, of course, equal to the number of bits of data contained in the block. In one embodiment, the block size is 128 bits so there are 128 pairs of output terminals 78.

A block read latch and gating circuit 76 is coupled to the output terminals 78, and operates in two modes. First, the circuit 76 latches the block of data provided on the output terminals 78. After latching the block of data, the circuit 76 operates under control of the control circuit 64, to sequentially transfer subblocks of data contained in the block to an I/O bus 80. In one embodiment, the I/O bus 80 is 16 bits wide and each subblock is likewise 16 bits wide so that the 128 bit block stored in the block latch 76 is sequentially transferred to the I/O bus 80 in eight 16 bit subblocks. The subblocks of data sequentially placed on the I/O bus 80 by the circuit 76 are sequentially placed on the data bus 54 through the data output buffer 62. The block read latch and gating circuit 76 includes conventional circuitry for performing the described functions as understood by one skilled in the art and will therefore not be described in further detail.

The operation of the DRAM 50 during a block read data transfer operation will now be described with reference to the signal timing diagram of FIG. 5. In operation, external circuitry, such as a DRAM controller or a processor, places address, data, and control signals on the address bus 52 (ADDR), data bus 54 (DQ), and control bus 56, respectively. The control circuit 64 includes conventional circuitry for controlling operation of the DRAM 50, and one skilled in the art will understand how such circuitry is adapted to control the components of the DRAM 50 in response to the control signals $\overline{RAS}$, $\overline{CAS}$, $\overline{WE}$, and $\overline{OE}$.

Figure 1:
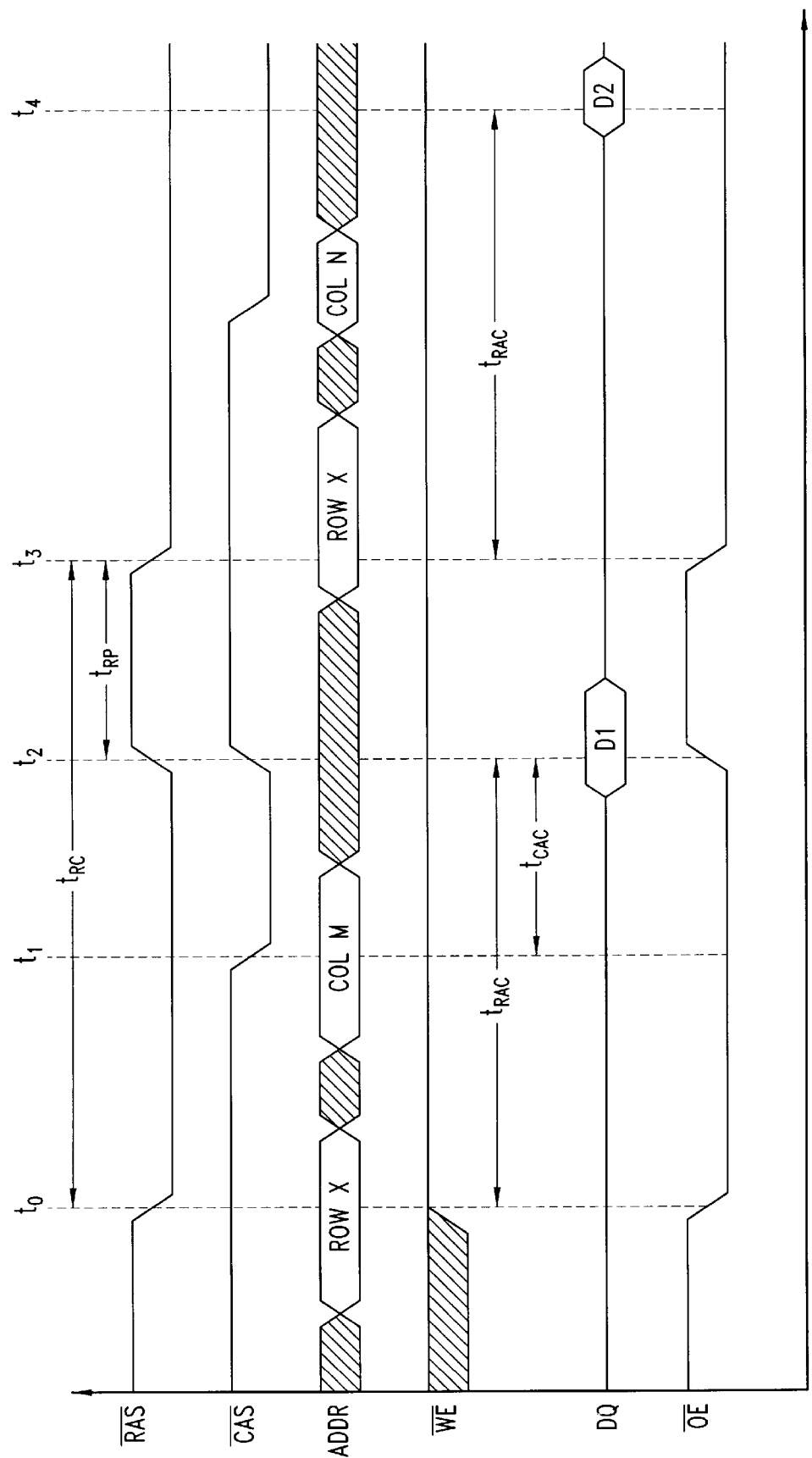
FIG. 1 is a signal timing diagram of a conventional read cycle.
Figure 2:
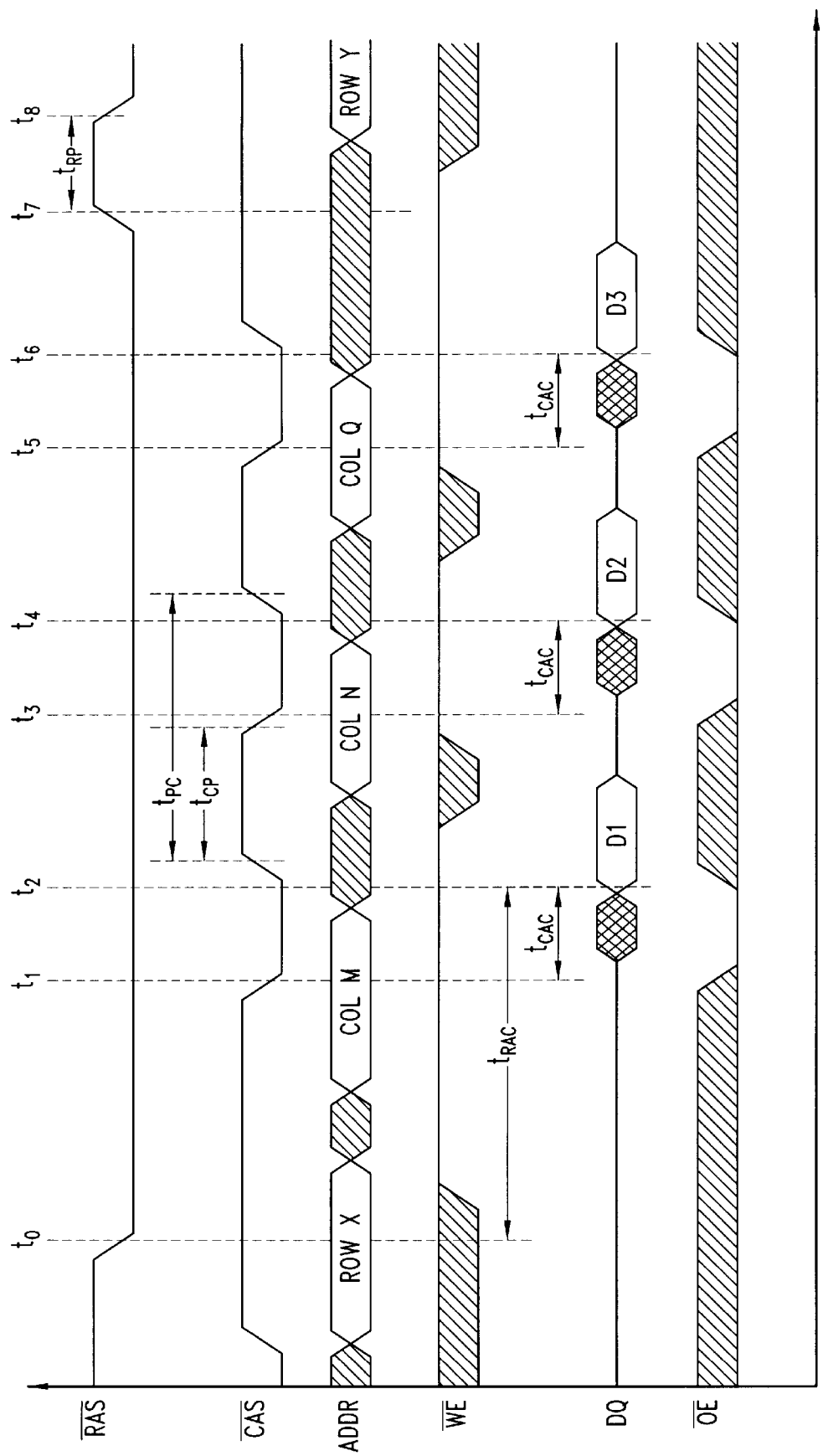
FIG. 2 is a signal timing diagram of a conventional Fast Page-Mode read cycle.
Figure 3:
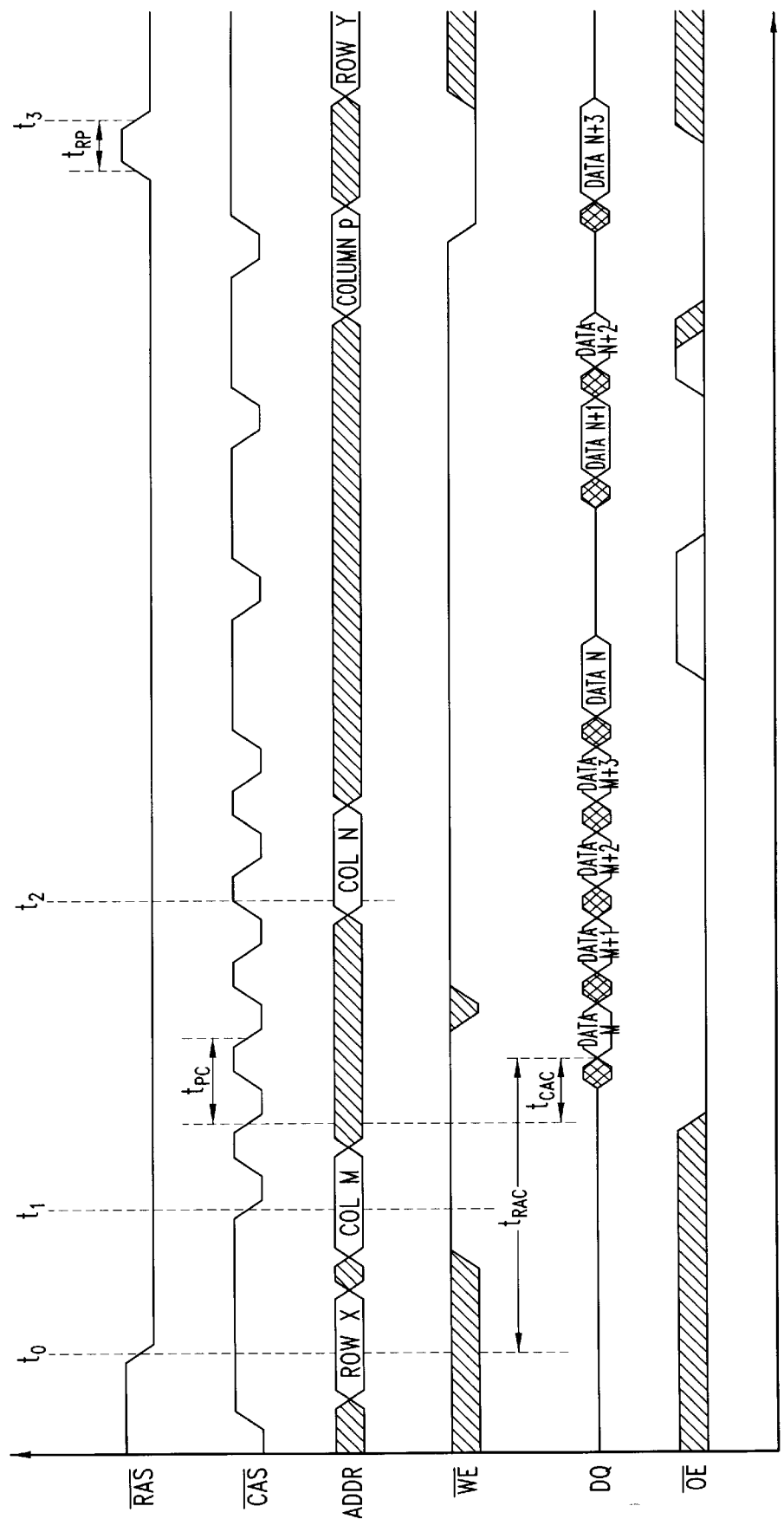
FIG. 3 is a signal timing diagram of a conventional Burst Mode read cycle.

To start a block read data transfer operation, the processor drives the write enable signal $\overline{WE}$ high to define a read operation, and clocks the column address strobe signal $\overline{CAS}$ at a Page Mode cycle time $t_{PC}$ to drive the control circuit 64 which controls operation of the various components in the DRAM 50 as will be discussed in more detail below. The clocked column address strobe signal $\overline{CAS}$ functions as a clock signal for the DRAM 50, and various operations during the block read data transfer operation are performed on associated rising edges of the signal $\overline{CAS}$. The column address strobe signal $\overline{CAS}$ may be alternately referred to as the "clock" signal, and the page mode cycle time $t_{PC}$ referred to as the "clock cycle" hereinafter. The processor drives the row address strobe signal $\overline{RAS}$ low between times $t_0$ and $t_1$, and in response to this low going pulse of the signal $\overline{RAS}$ the memory-cell array 68 is precharged. The processor then places a row address ROWX on the address bus 52 at the same time or at some later time, which in FIG. 2 is just before a time $t_2$. In the embodiment of FIG. 5, the time $t_2$ is two clock cycles after the row address strobe signal $\overline{RAS}$ goes low at time $t_0$, but the precise time depends upon operational characteristics of various components in the DRAM 50. Thus, for proper control of the DRAM 50, the processor need merely place the row address ROWX on the address bus 52 some predetermined number of clock cycles after driving the row address strobe signal RAS low. In response to the rising edge of the signal $\overline{CAS}$ at time $t_2$, the row address latch 65 latches the row address ROWX under control of the control circuit 64. Once latched, the row address latch 65 outputs the row address ROWX to the row decoder 66, which begins decoding the row address ROWX and, once decoded, activates the corresponding word line WL.

At a time $t_3$, the processor drives the output enable signal $\overline{OE}$ low causing the control circuit 64 to place the data output buffer 62 in a low impedance state, thereby coupling the I/O bus 80 to the data bus 54 through the data output buffer 62. While the row address ROWX is propagating through the row decoder 66, the processor, just before a time $t_4$, places a column address COLX on the address bus 52. The processor places the column address COLM on the bus 52 some predetermined number of clock cycles after the row address ROWX. In response to the rising edge of the column address strobe signal $\overline{CAS}$ at the time $t_4$, the column address COLM is latched into the column address latch 70 under control of the control circuit 64. The latched column address COLM is output to the column decoder and block gating circuit 72 which begins decoding the column address. During this time, the row decoder 66 completes decoding the row address ROWX and activates the corresponding word line WL in the memory-cell array 68. Once the addressed word line WL is activated, the control circuit 64 activates the sense amplifiers in the circuit 74 so that the sense amplifiers sense and store the data in the memory cells coupled to the activated word line WL. As previously discussed, the data stored in each memory cell coupled to the activated word line WL is sensed and stored in an associated sense amplifier in the circuit 74.

Between the time $t_4$ and a time $t_5$, the column decoder and block gating circuit 72 completes decoding the column address COLM and transfers the data stored in the memory cells of the addressed block to the data lines 78 where it is latched by the block read latch and gating circuit 76 under control of the control circuit 64. Beginning at the time $t_5$, the block of data stored in the circuit 76 is sequentially transferred in subblocks onto the I/O bus 80 and through the data output buffer 62 onto the data bus 54. The subblocks are transferred out of the block latch 76 under control of the control circuit 64 in response to the clocking of the column address strobe signal $\overline{CAS}$ by the processor. One subblock is transferred onto the data bus 54 every Page Mode cycle time $t_{PC}$.

The first subblock DATAM of the addressed block of data corresponding to row address ROWX and column address COLM is placed on the data bus 54 at the time $t_5$. The next subblock of data DATAM+1 is placed on the data bus 54 at a time $t_6$, and each subsequent subblock of data contained in the addressed block is placed on the data bus 54 the Page Mode cycle time $t_{PC}$ after the preceding subblock. Thus, the subblocks DATAM+1, M+2, . . . M+7 are sequentially placed on the data bus 54 at the Page Mode cycle time $t_{PC}$. After supplying the column address COLM, the processor knows the first subblock of data DATAM will be available a certain number of clock cycles later, and that thereafter one subblock is available every Page Mode cycle time $t_{PC}$.

At a time $t_7$, the processor once again drives the row address strobe signal $\overline{RAS}$ low until a time $t_8$ to thereby deactivate the row ROWX and precharge the memory-cell array 68 in anticipation of the next row address to be latched. Note that if another row in the already activated row ROWX is to be accessed, the row address strobe signal $\overline{RAS}$ is held high by the processor at time $t_7$, and a new column address corresponding to the next block of data is latched in its normal time slot. Unlike a conventional DRAM, with the DRAM 50 the memory-cell array 68 is precharged while the subblocks DATA M-M+7 contained in the addressed block of data are being sequentially placed on the data bus 54. As seen in FIG. 5, the row precharge time $t_{RP}$ lasts from the time $t_7$ to a time $t_9$ during which the subblocks DATAM+2 to DATAM+4 are sequentially placed on the data bus 54. The row precharge of the memory-cell array 68 can occur during this time because the addressed block of data has been stored in the block read latch and gating circuit 76. Thus, once an addressed block of data has been stored in the circuit 76 the memory-cell array 68 may be precharged in anticipation of activating the next addressed row in the memory-cell array 68.

The row precharge time $t_{RP}$ has elapsed at the time $t_9$, and just before the time $t_9$ the processor places a new row address ROWY on the address bus 52, which is latched into the row address latch 65 in response to the rising edge of the column address strobe signal $\overline{CAS}$ at time $t_9$. The processor then places a column address COLN on the address bus 52 just before a time $t_{10}$, which is latched into the column address latch 70 in response to the rising edge of the signal $\overline{CAS}$ at the time $t_{10}$. The new row address ROWY and column address COLN are decoded by the row decoder 66 and column decoder 72, respectively, as previously described.

Figure 5:
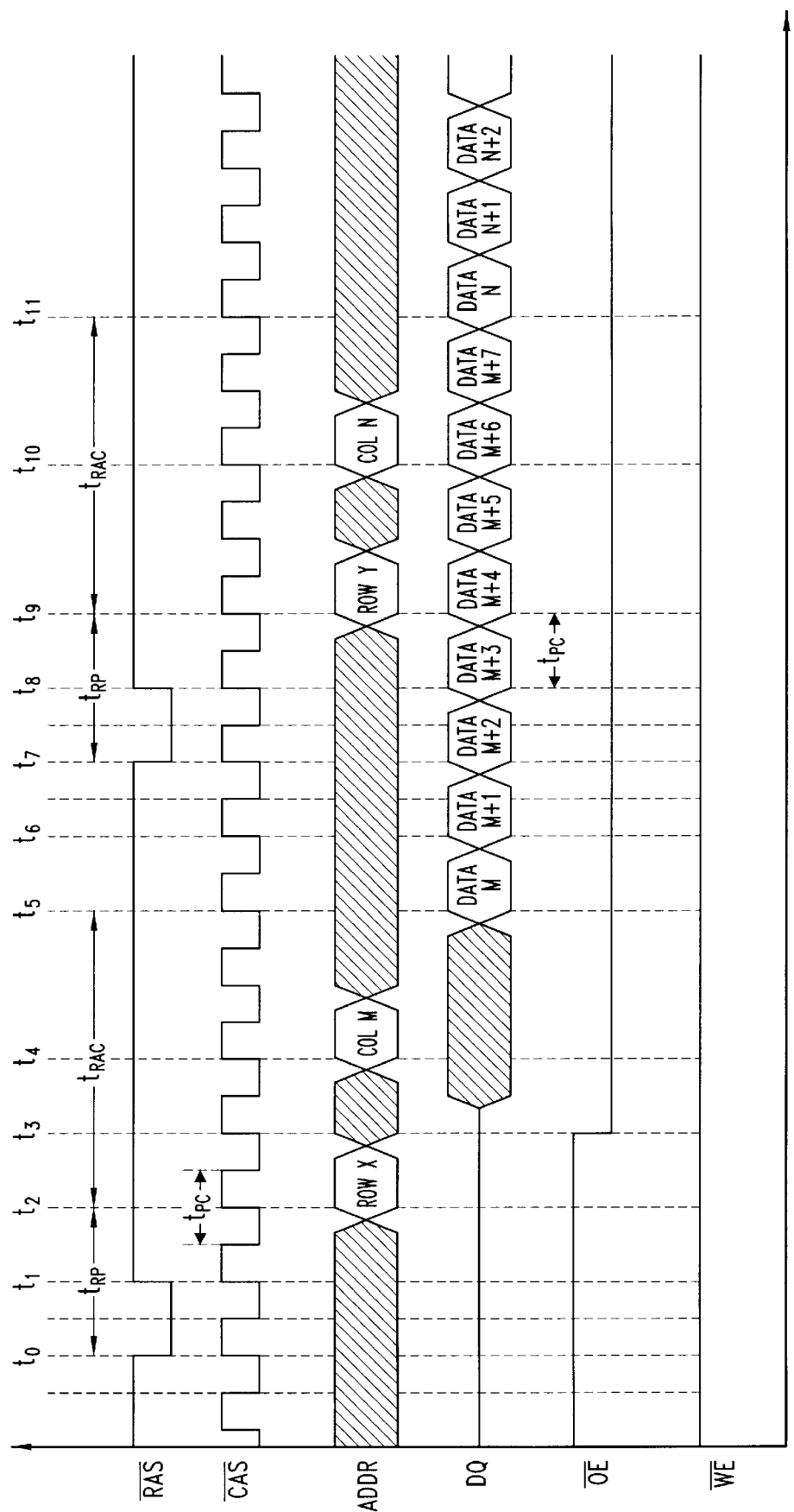
FIG. 5 is a signal timing diagram of a block read cycle of the dynamic random access memory of FIG. 4.

From the signal timing diagram of FIG. 5, it is seen that the new row address ROWY and column address COLN are latched into the DRAM 50 and decoded while the subblocks DATAM+4 to DATAM+7 of the previously addressed block of data are being sequentially placed on the data bus 54. After the last subblock DATAM+7 is placed on the data bus 54, the column decoder and block gating circuit 72, under control of the control circuit 64, transfers the data stored in the memory cells of the new addressed block to the data lines 78 and the block read latch and gating circuit 76 latches the new block. At a time $t_{11}$, the first subblock DATAN of this new block is placed on the data bus 54 the Page Mode cycle time $t_{PC}$ after the last subblock DATAM+7 of the previous block. With the DRAM 50, even though the new addressed block has a different row address ROWY than the previous row address ROWX, there is no delay for the row precharge time $t_{RP}$ and the row access time $t_{RAC}$ as with prior art DRAMS. Note that in FIG. 5 the row access time $t_{RAC}$ is defined as the time between when the row address is latched into the DRAM 50 and when the first subblock of data corresponding to that row address is placed on the data bus 54.

The block read operation of the DRAM 50 hides the row access time $t_{RAC}$ and row precharge time $t_{RP}$ by causing these times to elapse while the subblocks of a previously addressed block of data are being sequentially placed on the data bus 54. The number of bits in a block and the rate at which subblocks are sequentially placed on the data bus 54 are selected so that the row precharge time $t_{RP}$ and row access time $t_{RAC}$ occur while the subblocks of a previously accessed block of data are being sequentially placed on the data bus 54. The page mode cycle time $t_{PC}$, block size and number of subblocks must be chosen so that all subblocks of a first accessed block are sequentially transferred to the data bus 54 during the time it takes the DRAM 50 to perform the next row precharge and row access as defined by the times $t_{RP}$ and $t_{RAC}$, respectively. In this way, after the latency associated with the initial access of the DRAM 50, the bandwidth of the DRAM 50 is determined by the Page Mode cycle time $t_{PC}$ and no Page Miss penalty is incurred.

The DRAM 50 operates in a conventional manner to write data into addressed memory cells in the memory-cell array 68. During a write data transfer operation, the processor drives the output enable signal $\overline{OE}$ high to place the data output buffer 62 in a high impedance state and drives the write enable signal $\overline{WE}$ low to thereby couple the data bus DQ to the I/O bus 80 through the data input buffer 60. To begin a write data transfer operation, the processor places a row address on the address bus 52 and then drives the row address strobe signal $\overline{RAS}$ low. In response to the row address strobe signal $\overline{RAS}$ going low, the row address latch 65 latches the row address under control of the control circuit 64 and outputs the latched row address to the row decoder 66. The row decoder 66 decodes the row address and activates the word line WL corresponding to the latched row address. While the row decoder 66 is decoding the latched row address, the processor places a column address on the address bus 52 and drives the column address strobe signal $\overline{CAS}$ low, causing the column address latch 70 to latch the column address and output the latched column address to the column decoder and block gating circuit 72. The processor then places the data to be written to the addressed memory cells on the data bus 54 and this data is transferred through the data input buffer 60 and onto the I/O bus 80, and from the I/O bus 80 through the circuit 72 to the digit lines DL of the addressed memory cells in the memory-cell array 68. While the digit lines DL of the addressed memory cells are driven at voltage levels corresponding to the data to be stored in the addressed memory cells, the corresponding word line WL is deactivated to thereby store the written data in the addressed memory cells.

Although the DRAM 50 has been described as including only a single memory-cell array 68, one skilled in the art will realize the operation described above can be applied equally advantageously to a DRAM with multiple "banks" of memory-cell arrays. Thus, the DRAM 50 could include multiple banks of memory-cell arrays with individual banks operating as previously described, or a block of data in a first bank could be accessed and sequentially transferred onto the data bus 54 while a second bank is precharged and a second block of data in the second bank accessed.

In another embodiment of the DRAM 50, the sense amplifiers in the circuit 74 are utilized to store the addressed block of data instead of the block read latch and gating circuit 76. In this embodiment, the sense amplifiers in the sense amplifier and equilibration circuit 74 would typically be conventional "helper flip-flop" type latching sense amplifiers comprising two NMOS and two PMOS transistors connected to form a pair of cross-coupled inverters between respective digit lines DL in the memory array 68. The helper flip-flop type latching sensing amplifiers operate to sense and store the data in the memory cells in the addressed row in a conventional manner. For the sake of brevity, a more detailed description of the latching type sense amplifiers and their operation in the DRAM 50 is not provided but is well understood by one skilled in the art. In this embodiment, the data stored in the 128 sense amplifiers corresponding to the addressed block is thereafter sequentially transferred onto the I/O bus 80 in eight 16 bit subblocks in response to the column address latch/counter circuit 70. While the addressed block of data stored in the helper flip-flop type latching sense amplifiers is being sequentially transferred onto the I/O bus 80, the memory-cell array 68 is isolated from the sense amplifiers, and precharged and equilibrated in a conventional manner. Thus, the memory-cell array 68 may be precharged and equilibrated, and a subsequent row of memory cells containing a subsequent addressed block of data activated, while the subblocks of a previously addressed block stored in the sense amplifiers are being sequentially placed on the data bus 54. Once the last subblock of the addressed block has been placed on the data bus 54, the helper flip-flop type latching sense amplifiers may be quickly equilibrated in anticipation of sensing and storing the data in the addressed row corresponding to the subsequent addressed block of data.

Figure 6:
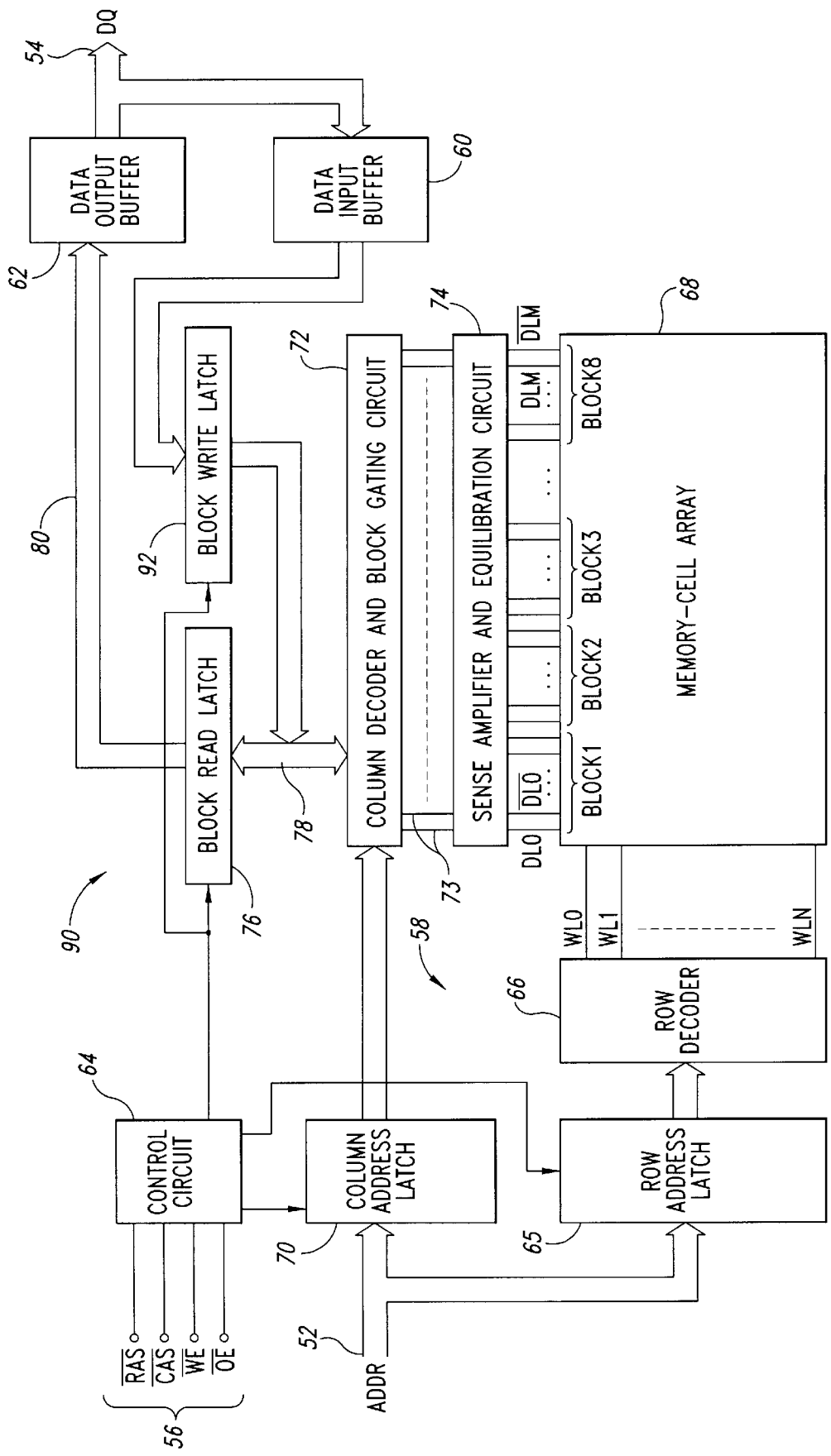
FIG. 6 is a functional block diagram of a dynamic random access memory according to another embodiment of the present invention.

FIG. 6 is a block diagram of a DRAM 90 according to another embodiment of the present invention. The DRAM 90 is identical to the DRAM 50 described with reference to FIG. 4 except for the inclusion of a block write latch 92 in the data write path of the DRAM 90. The components of the DRAM 90 that are common to the DRAM 50 have been given the same reference numerals and will not, for the sake of brevity, be described in further detail. The DRAM 90 includes the block write latch 92 coupled between the data input buffer 60 and the data lines 78 of the column decoder and block gating circuit 72. The block write latch 92 is controlled by the control circuit 64 to sequentially receive subblocks of data placed on the data bus 54 through the data input buffer 60. The block write latch 92 is typically the same size as the block read latch 76 and in one embodiment sequentially receives eight 16-bit subblocks placed on the data bus 54. When all eight of the subblocks have been sequentially received and stored by the block write latch 92, the write latch 92 outputs the data contained in these subblocks over the data lines 78 to the column decoder and block gating circuit 72 which in turn outputs the block of data stored in the block write latch 92 on the lines 73 corresponding to the addressed block of data in the memory-cell array 68. The block write latch 92 includes conventional circuitry for performing the described functions as understood by one skilled in the art and will therefore not be described in further detail.

The DRAM 90 operates identical to the DRAM 50 during a block read operation and will not therefore be further described during such a data transfer operation. The operation of the DRAM 90 during a block write data transfer operation will now be described with reference to the signal timing diagram of FIG. 7. During a block write data transfer operation, the processor or other external circuit maintains the output enable signal $\overline{OE}$ high to keep the data output buffer 62 in a high impedance state and clocks the column address strobe signal $\overline{CAS}$ at the page mode cycle time $t_{PC}$. To begin a block write data transfer operation, the processor drives the write enable signal $\overline{WE}$ low just before a time $t_0$ indicating a write data transfer operation. In response to the signal $\overline{WE}$ going low, the data input buffer 60 is placed in a low impedance state coupling the data bus 54 to the block write latch 92 through the data input buffer 60. At this point, the block write latch 92 begins latching subblocks of data in response to rising edges of the column address strobe signal $\overline{CAS}$ as will be explained below. During the block write data transfer operation, the control circuit 64 controls operation of the various circuits in the DRAM 90 utilizing conventional circuitry, and one skilled in the art will understand how such circuitry is adapted to control the block write latch 92 and other DRAM 90 components in response to the control signals $\overline{RAS}$, $\overline{CAS}$, $\overline{WE}$, and $\overline{OE}$.

The processor places a first subblock of data DATAM on the data bus 54 just before the time to. This subblock of data DATAM is latched into the block write latch 92 under control of the control circuit 64 in response to the rising edge of the column address strobe signal $\overline{CAS}$ at the time $t_0$. The processor then places a second subblock of data DATAM+1 on the data bus 54 just before a time $t_1$, which is latched into the block write latch 92 in response to the rising edge of the signal $\overline{CAS}$ at the time $t_1$. The processor continues to sequentially place subblocks of data on the data bus 54, and these subblocks are sequentially latched into the block write latch 92 under control of the control circuit 64 in response to consecutive rising edges of the column address strobe signal $\overline{CAS}$.

While the subblocks are being sequentially latched into the block write latch 92, the processor drives the row address strobe signal $\overline{RAS}$ low from a time $t_2$ until a time $t_3$. As previously described, the memory-cell array 68 is precharged in response to this low going pulse of the signal $\overline{RAS}$. At some predetermined time later, which is just before a time $t_4$ in FIG. 7, the processor places a row address ROWX on the address bus 52, and this row address is latched into the row address latch 65 in response to the rising edge of the signal $\overline{CAS}$ at time $t_4$. The row address latch 65 outputs the row address ROWX to the row decoder 66 which begins decoding the row address ROWX and, once decoded, activates the corresponding word line WL. The processor thereafter places a column address COLM on the address bus 52 some predetermined number of clock cycles later, which is just before a time $t_5$ in FIG. 7. At the time $t_5$, the rising edge of the column address signal $\overline{CAS}$ latches this column address into the column address latch 70 which outputs the column address COLM to the circuit 72. As seen in the signal timing diagram of FIG. 7, during the time the row address ROWX and column address COLM are placed on the address bus 52 and latched by the DRAM 90, the processor continues to place subblocks of data on the data bus 54 and these subblocks are sequentially latched into the block write latch 92 in response to consecutive rising edges of the signal $\overline{CAS}$.

At the time $t_5$, eight subblocks of data DATAM-M+7 have been latched into the block write latch 92 and are thus ready to be transferred to the memory cells in the memory-cell array 68 corresponding to the row address ROWX and column address COLM. At this point, the row decoder 66 has completed decoding the row address ROWX and activated the corresponding word line WL, and the column decoder and block gating circuit 72 has completed decoding the column address COLM. The block of data stored in the block write latch 92 is then output over the data lines 78, through the circuits 72 and 74 to the corresponding digit lines DL of the memory-cell array 68. The word line WL corresponding to the row address ROWX is then deactivated to store the block of data in corresponding memory cells in the memory-cell array 68.

After the block of data comprising subblocks DATAM-M+7 has been transferred from the block write latch 92 to the corresponding digit lines DL in the memory-cell array 68, which occurs shortly after the time $t_5$, the processor continues sequentially placing subblocks of data on the data bus 54 corresponding to the next block of data to be written to the DRAM 90 during the subsequent block write operation. The processor sequentially places the first subblock DATAN on the data bus 54 just before the time $t_6$, which is the page mode cycle time $t_{PC}$ after the preceding subblock DATA M+7. The subblock DATAN is latched into the block write latch 92 in response to the rising edge of the column address strobe signal $\overline{CAS}$ at the time $t_6$. At a time $t_7$, the processor pulses the row address strobe signal $\overline{RAS}$ low, thereby causing precharge of the memory-cell array 68, and the processor thereafter proceeds as previously described to latch the row address ROWY and column address COLN, and write the new block of data to the corresponding memory cells in the memory-cell array 68.

Figure 7:
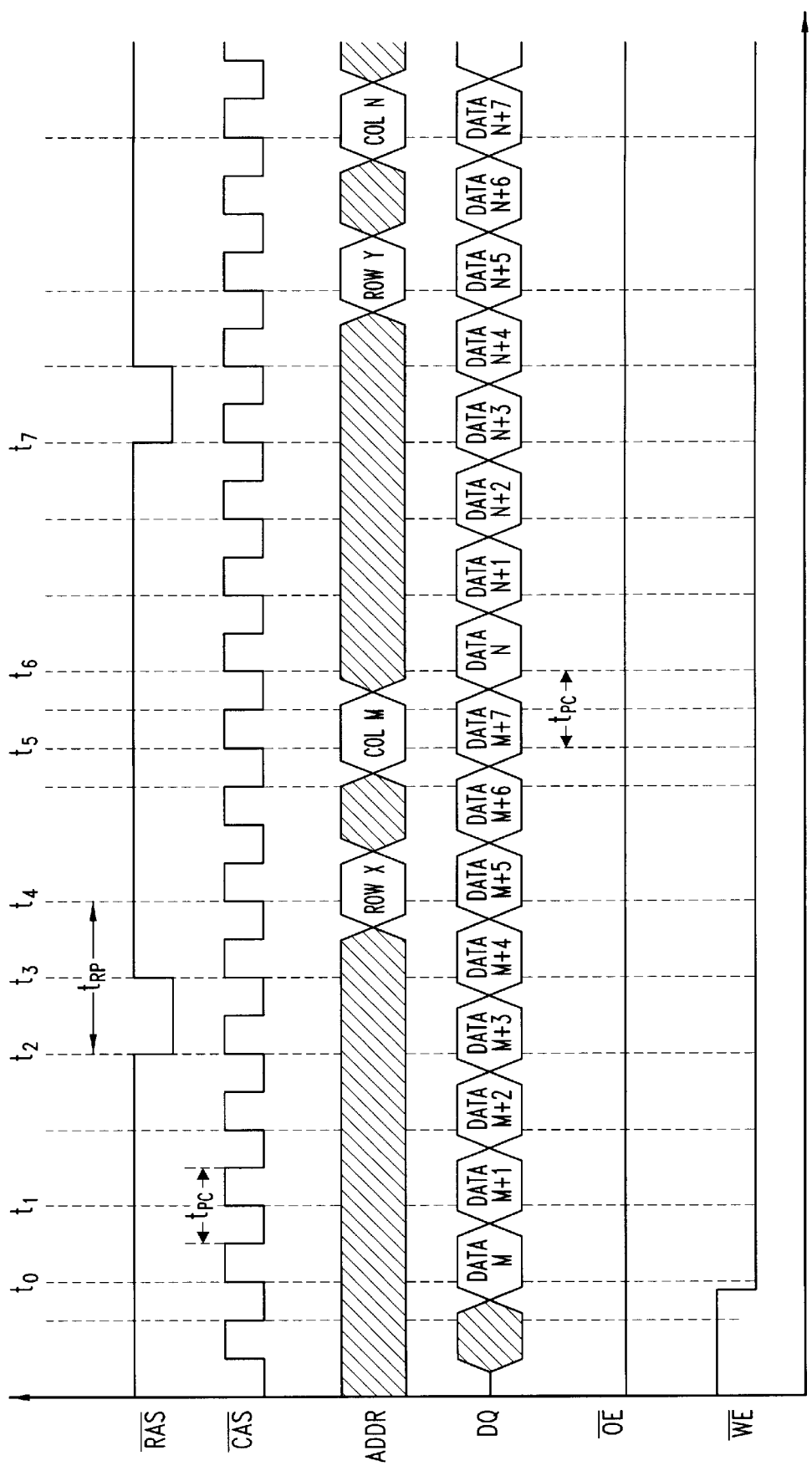
FIG. 7 is a signal timing diagram of a block write cycle of the dynamic random access memory of FIG. 6.

As seen in the signal timing diagram of FIG. 7, writing blocks of data into random rows in the DRAM 90 is achieved without experiencing the delays due to the row precharge time $t_{RP}$ and decoding of row and column addresses associated with prior art memory devices. This is true because the row precharge time $t_{RP}$ and decoding of row and column addresses occur while subblocks of data are being sequentially transferred over the data bus 54 and into the block write latch 92. The rate of the sequential data transfers over the data bus 54 and Page Mode cycle time $t_{PC}$ of the column address strobe signal $\overline{CAS}$ are selected such that precharge of the memory-cell array 68 and decoding of the row and column addresses occur in the time it takes to sequentially transfer all the subblocks into the block write latch 92. Thus, subblocks are sequentially placed on the data bus 54 at the page mode cycle time $t_{PC}$, and, after the initial write operation to the DRAM 90, there is no delay in writing data to the DRAM 90 due to activating different rows in the memory-cell array 68.

With the DRAM 90, consecutive block read data transfer operations and consecutive block write data transfer operations have a bandwidth determined by the Page Mode cycle time $t_{PC}$. In addition, a block write operation followed by a block read operation of the same row in the memory-cell array 68 results in no decrease in bandwidth. There are two situations, however, where the bandwidth of the DRAM 90 is decreased causing the processor to experience delays in reading data from or writing data to the DRAM 90. The first situation is a block write operation to a first row in the memory-cell array 68 followed immediately by a block read operation to a different row in the memory-cell array 68. In this situation, the processor cannot read data from the DRAM 90 until after expiration of the row precharge time $t_{RP}$ and row access time $t_{RAC}$ because of the need to precharge the memory-cell array 68 and activate the row of memory cells corresponding to the second row address. The second situation in which the processor experiences a delay in transferring data to and from the DRAM 90 occurs when a block read operation is followed immediately by a block write operation and is due to the need to sequentially transfer the subblocks comprising the block of data to be written to the DRAM 90 into the block write latch 92 after termination of the block read data transfer operation.

As previously discussed with reference to the DRAM 50, helper flip-flop type latching sense amplifiers may be used in the DRAM 90 instead of the block read latch 76. Furthermore, the DRAM 90 may include multiple banks of memory-cell arrays with individual banks operating as previously described during a block write data transfer operation, or a first block of data written to a first bank while a second bank is precharged.

Figure 8:
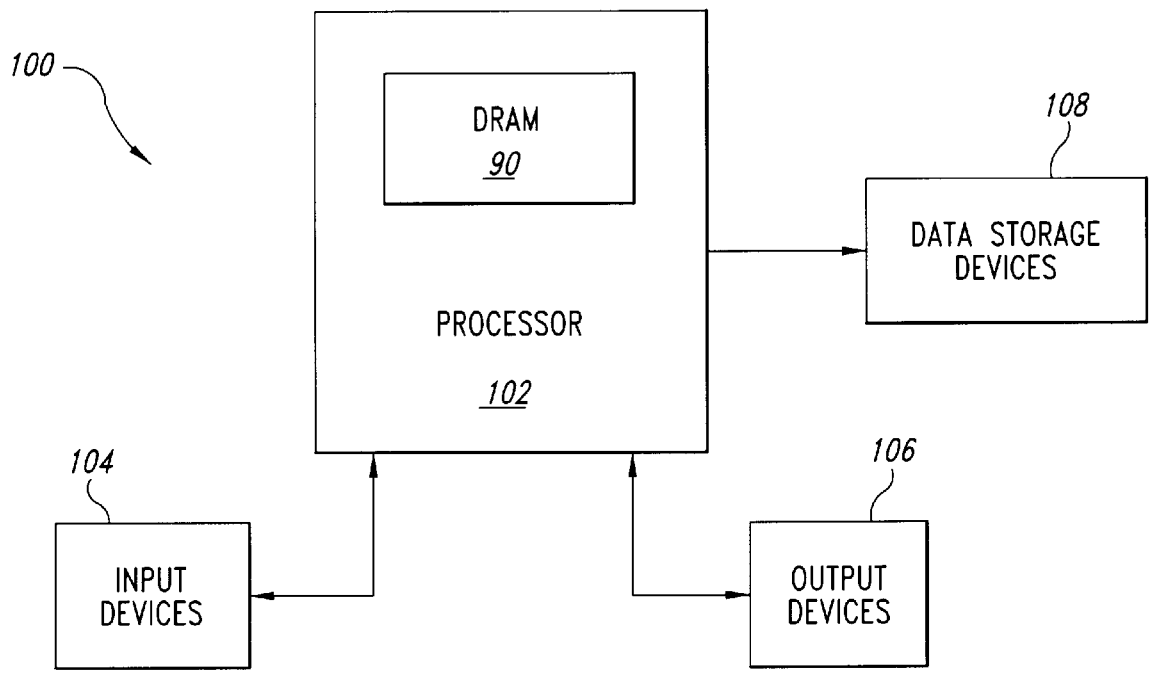
FIG. 8 is a computer system including the dynamic random access memory of FIG. 6.

FIG. 8 is a block diagram of a computer system 100 which uses the DRAM 90 of FIG. 6. The computer system 100 includes a processor 102 for performing various computing functions, such as executing specific software to perform specific calculations or tasks. In addition, the computer system 100 includes one or more input devices 104, such as a keyboard or a mouse, coupled to the processor 102 to allow an operator to interface with the computer system 100. Typically, the computer system 100 also includes one or more output devices 106 coupled to the processor 102, such output devices typically being a printer or a video terminal. One or more data storage devices 108 are also typically coupled to the processor 102 to store data or retrieve data from the external storage media (not shown). Examples of typical storage devices 108 include hard and floppy disks, tape cassettes, and compact disk read-only memories (CD-ROMs). The processor 102 is typically coupled to the DRAM 90 through a control bus, a data bus, and an address bus to provide for writing blocks of data to and reading blocks of data from the DRAM 90.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

What is claimed is:

1. A memory device having address, data, and control buses, the memory device comprising:
   a memory-cell array including a number of memory cells arranged in rows and columns, each memory cell operable to store a bit of data;
   a row address decoder circuit adapted to receive a row address applied on the address bus and operable to decode the row address and activate a row of memory cells corresponding to the decoded row address;
   a column address decoder circuit adapted to receive a column address applied on the address bus and operable to decode the column address and access a plurality of memory cells in the activated row, the data stored in the plurality of memory cells in the activated row being defined as a block of data;
   a precharge circuit coupled to the memory-cell array operable, when activated, to precharge and equilibrate the memory-cell array;
   a block read latch circuit operable to latch a first block of data accessed in the memory-cell array corresponding to first decoded row and column addresses, and to sequentially transfer subblocks of the first block of data onto the data bus, the memory device operable such that after the first block of data is latched in the block read latch circuit, the precharge circuit first precharges and equilibrates the memory-cell array, and the row and column decoder circuits then decode second row and column addresses such that the column address decoder circuit accesses a second block of data corresponding to the second row and column addresses, the second block of data being accessed before the block read latch circuit has completed sequentially transferring all the subblocks of the first block of data onto the data bus; and
   a control circuit adapted to receive a first signal and a second signal on the control bus, the control circuit being coupled to the row and column address decoder circuits, the precharge circuit, and the memory-cell array, the control circuit being operable to, activate the precharge circuit in response to a transition of the first signal to thereby precharge and equilibrate the memory-cell array, after the memory-cell array has been precharged and equilibrated, control the row decoder circuit to latch the first row address in response to a first transition of the second signal, control the column decoder circuit to latch the first column address in response to a subsequent transition of the second signal, control the block read latch circuit to latch the first block of data corresponding to the first row and column addresses, control the block read latch circuit to sequentially transfer onto the data bus subblocks of the first block of data, activate the precharge circuit in response to a transition of the first signal to equilibrate the memory-cell array while the first block of data is being sequentially transferred onto the data bus, and control the row and column decoder circuits to latch second row and column addresses, respectively, in response to respective second and third transitions of the second signal, such that the column address decoder circuit accesses a second block of data corresponding to the second row and column addresses while the first block of data is being sequentially transferred onto the data bus.

2. The memory device of claim 1 wherein the first and second row addresses are unequal.

3. The memory device of claim 1 wherein the block of data comprises the data stored in all of the memory cells of the activated row.

4. The memory device of claim 1, further including a number of memory-cell arrays, the first block of data being stored in a first memory-cell array, and the second block of data being stored in a second memory-cell array.

5. The memory device of claim 1 wherein the block read latch is included in a sense amplifier circuit in the memory device.

6. A memory device having address, data, and control buses, comprising:

a memory-cell array including a number of memory cells arranged in rows and columns, each memory cell in a particular row having an access terminal coupled to an associated word line and each memory cell in a particular column having a data terminal coupled to one of an associated pair of true and complement digit lines;

a row decoder adapted to receive a row address on the address bus and including a number of output terminals, each output terminal coupled to a respective word line and the row decoder operable to decode a row address applied on the address bus and activate the word line corresponding to the decoded row address;

a sense amplifier and equilibration circuit coupled to the digit lines of the memory-cell array and operable in a first mode to precharge the memory-cell array by driving digit lines to predetermined voltage levels and equalize the voltage levels on the digit lines, and operable in a second mode to sense and store in respective sense amplifiers the data stored in each memory cell coupled to an activated word line;

a column decoder and block gating circuit adapted to receive a column address applied on the address bus, and operable in a first mode to decode the column address, and operable in a second mode to transfer a block of data from the sense amplifier and equilibration circuit to an output in response to the decoded column address, the block of data corresponding to the data stored in a number of memory cells in the activated row;

a block read latch circuit coupled to the output of the column decoder and block gating circuit and operable in a first mode to latch the block of data output by the column decoder and block gating circuit, and operable in a second mode to sequentially transfer the latched block of data onto the data bus N bits at a time in response to the second signal; and a control circuit adapted to receive a first signal and a second signal on the control bus, the control circuit coupled to the row address decoder, column address decoder, sense amplifier and equilibration circuit, and the block read latch circuit, and operable, in response to the first and second signals, to, activate, in response to the first signal, the sense amplifier and equilibration circuit in the first mode to precharge the memory-cell array, activate, after the sense amplifier and equilibration circuit have been activated in the first mode, the row address decoder in response to a transition of the first signal so that the row address decoder latches and decodes a first row address, activate the sense amplifier and equilibration circuit in the second mode to sense and store the data in the memory cells corresponding to the first row address, activate the column decoder and block gating circuit in the first mode in response to a transition of the second signal so that the column address decoder latches and decodes a first column address, activate the column decoder and block gating circuit in the second mode to transfer a first block of data corresponding to the first row and column addresses from the sense amplifier and equilibration circuit to the output of the column decoder and block gating circuit, activate the column decoder and block gating circuit in the first mode to latch the first block of data on the output of the column decoder and block gating circuit, activate the column decoder and block gating circuit in the second mode to sequentially transfer the latched first block of data to the data bus N bits at a time in response to consecutive transitions of the second signal, activate, in response to the first signal, the sense amplifier and equilibration circuit in the first mode to precharge the memory-cell array, the sense amplifier and equilibration circuit being activated while the latched first block of data is being sequentially transferred to the data bus;

activate, after the memory-cell array has been precharged and while the latched first block of data is being sequentially transferred to the data bus, the row address decoder in response to a transition of the first signal so that the row address decoder latches and decodes a second row address, and activate, while the latched first block of data is being sequentially transferred to the data bus, the column decoder in the first mode in response to the second signal so that the column address decoder latches and decodes a second column address.

7. The memory device of claim 6 wherein the block read latch circuit is included in the sense amplifier portion of the sense amplifier and equilibration circuit.

8. The memory device of claim 6 wherein the first and second row addresses are unequal.

9. The memory device of claim 6 wherein the block of data comprises the data stored in all of the memory cells of the activated row.

10. The memory device of claim 6, further including a number of memory-cell arrays, the first block of data being stored in a first memory-cell array, and the second block of data being stored in a second memory-cell array.

11. A memory device having address and data buses, the memory device including a terminal adapted to receive a first signal, and a terminal adapted to receive a second signal being clocked to have a page mode cycle time, the memory device comprising:

a memory-cell array including a number of memory cells arranged in rows and columns, each memory cell operable to store a bit of data;

a row address decoder circuit adapted to receive a row address applied on the address bus and operable to latch and decode the row address responsive to the first signal, and activate a row of memory cells corresponding to the decoded row address;

a column address decoder circuit adapted to receive a column address applied on the address bus and operable to latch and decode the column address responsive to the second signal, and access a plurality of memory cells in the activated row, the data stored in the plurality of memory cells in the activated row being defined as a block of data;

a precharge circuit coupled to the memory-cell array operable responsive to the first signal to precharge and equilibrate the memory-cell array;

a block storage circuit operable to latch a first block of data accessed in the memory-cell array corresponding to first decoded row and column addresses and to sequentially transfer subblocks of the first block of data onto the data bus; and a control circuit coupled the row and column address decoder circuits, the precharge circuit, and the block storage circuit, and coupled to the respective terminals to receive the first signal and the second signal, the control circuit operable to, activate the precharge circuit in response to a first transition of the first signal to thereby precharge and equilibrate the memory-cell array, activate, responsive to a second transition of the first signal, the row address decoder to latch and decode a first row address, the second transition of the first signal occurring a predetermined number of page mode cycle times after the first transition of the first signal, activate, responsive to a first transition of the second signal, the column address decoder to latch and decode a first column address, the first transition of the second signal occurring a predetermined number of page mode cycle times after the second transition of the first signal, activate the block read latch circuit to latch a first block of data accessed in the memory-cell array corresponding to the first decoded row and column addresses, control the block read latch circuit to sequentially transfer subblocks of the first block of data onto the data bus, one subblock transferred onto the data bus each page mode cycle time, and the first subblock being transferred onto the data bus a predetermined number of page mode cycle times after the first transition of the second signal, activate, in response to a third transition of the first signal, the precharge circuit to thereby precharge and equilibrate the memory-cell array while the subblocks of the first block of data are being sequentially transferred onto the data.

12. The memory device of claim 11 wherein the memory device comprises a dynamic random access memory.

13. The memory device of claim 11 wherein the block storage circuit comprises a plurality of sense amplifiers coupled to the memory-cell array.

14. A method of reading data stored in a memory-cell array in a dynamic random access memory (DRAM) having address, and data buses, and adapted to receive a first signal and a second signal, the method comprising the steps of:

driving the first signal active;

precharging and equilibrating the memory-cell array in response to a first transition of the first signal;

latching and decoding a first row address in response to a first transition of the second signal occurring after the first transition of the first signal;

latching and decoding a first column address in response to a second transition of the second signal occurring after the first transition of the second signal;

sensing and storing a first block of data contained in the memory-cell array in response to the decoded first row and column addresses, the first block of data including n columns of memory cells in the row of memory cells corresponding to the decoded first row address;

transferring the first block of data onto the data bus sequentially in subblocks, each subblock containing a portion of the total number of bits n contained in the first block;

precharging and equilibrating the memory-cell array in response to a second transition of the first signal occurring during the step of transferring the first block of data onto the data bus;

latching and decoding a second row address in response to a third transition of the second signal occurring after the second transition of the first signal;

latching and decoding a second column address in response to a fourth transition of the second signal occurring after the third transition of the second signal; and sensing and storing a second block of data contained in the memory-cell array in response to the decoded second row and column addresses, the sensing and storing of the second block of data occurring before the last subblock of the first block of data has been sequentially transferred onto the data bus.

15. The method of claim 14 wherein the second signal is clocked to have a period equal to a page mode cycle time, and each of the first, second, third, and fourth transitions of the second signal occurs a certain number of page mode cycle times after the prior transition.

16. The method of claim 15 wherein each of the first, second, third, and fourth transitions of the second signal corresponds to a respective rising edge of the second signal.

17. A method of reading data stored in a dynamic random access memory (DRAM) having an address bus, data bus, control bus, and a memory-cell array including a plurality of memory cells arranged in rows and columns, the method comprising the steps of:

driving a first signal active and, in response to the first signal going active, precharging the memory-cell array;

latching a first row address placed on the address bus in response to a transition of a second signal, latching a first column address placed on the address bus in response to a transition of the second signal;

decoding the first row address and activating a first row of memory cells corresponding to the first decoded row address;

decoding the first column address;

storing a first block of data contained in the activated first row of memory cells in response to the decoded column address, the first block of data including n bits of data corresponding to the data stored in n columns of memory cells in the activated first row of memory cells;

transferring the first block of data onto the data bus sequentially in subblocks, each subblock containing a portion of the total number of bits n contained in the first block and each subblock being transferred out in response to transitions of the second signal which is toggled to have a period equal to a page mode cycle time, the first subblock being placed on the data bus a row access time after the transition of the second signal associated with the step of decoding the first row address;

performing, while the step of transferring the first block of data onto the data bus is occurring, the steps of, driving the first signal active, precharging the memory-cell array for a row precharge time in response to the first signal going active, decoding a second row address placed on the address bus in response to a transition of the second signal, decoding a second column address placed on the address bus in response to a transition of the second signal, activating a second row of memory cells corresponding to the second decoded row address, and storing a second block of data contained in the activated second row of memory cells in response to the second decoded column address; and transferring, after the step of transferring the first block of data onto the data bus is complete, the second block of data onto the data bus sequentially in subblocks in response to the second signal, the first subblock of the second block being transferred onto the data bus the page mode cycle time after the last subblock of the first block of data.

18. The method of claim 17 wherein the first subblock of the second block of data is placed on the data bus at a time approximately equal to the row access time after the transition of the second signal associated with the step of decoding the second row address.

19. The method of claim 17 wherein the first subblock of the second block is placed on the data bus at a time approximately equal to the row precharge time plus the row access time after the first subblock of the first block.

20. The method of claim 17 wherein the number of subblocks contained in each block of data times the page mode cycle time is approximately equal to the sum of the row access time plus the row precharge time.

* * * * *